United States Patent [19]

Chenevas-Paule et al.

[11] Patent Number: 4,587,720

[45] Date of Patent: May 13, 1986

[54] PROCESS FOR THE MANUFACTURE OF A SELF-ALIGNED THIN-FILM TRANSISTOR

[75] Inventors: André Chenevas-Paule, Grenoble; Bernard Diem, Meylan, both of France

[73] Assignee: Commissariat a l'Energie Atomique, Paris, France

[21] Appl. No.: 659,316

[22] Filed: Oct. 10, 1984

[30] Foreign Application Priority Data

Oct. 12, 1983 [FR] France .................. 83 16203

[51] Int. Cl.[4] .................. H01L 21/324; H01L 21/265
[52] U.S. Cl. .................................. 29/578; 29/571; 29/576 B; 29/576 J; 148/1.5; 148/175; 148/187; 148/DIG. 91
[58] Field of Search ............... 29/578, 576 B, 571, 29/576 J; 148/1.5, 187, 175

[56] References Cited

U.S. PATENT DOCUMENTS 4,380,864  4/1983  Das ........................ 29/574
4,398,343  8/1983  Yamazaki ................ 29/572
4,456,490  6/1984  Dutta et al. .............. 148/1.5

FOREIGN PATENT DOCUMENTS 0076587   4/1983  European Pat. Off. .
0090661  10/1983  European Pat. Off. .

OTHER PUBLICATIONS

IEEE Electron Device Letters, vol. EDL-3, No. 7, juillet 1982, New York (US).
T. Kodama et al: "Self-Alignment Process for Amorphous Silicon Thin Film Transistors", pp. 187-189 *pp. 187, 188, Alinea 2; FIG. 1*.
Sid International Symposium-Digest of Technical Papers, Edition 1, avril 1980, Lewis Winner, Coral Gables, Florida, (US).
E. Lueder: "Processing of Thin Film Transistors With Photolithography and Application for Displays", pp. 118, 119.

Primary Examiner—Upendra Roy

[57] ABSTRACT

The process consists in producing the grid (4) of the transistor on a glass substrate (2), depositing an insulating layer (6) on the substrate and grid, depositing a thick layer (8) of hydrogenated amorphous silicon on the insulating layer, depositing on the silicon layer a layer (10) of positive photosensitive resin sensitive to light of a wavelength greater than 550 nm, irradiating the resin layer through the substrate, the grid serving as a mask for the irradiation, developing the resin, etching the silicon layer until the insulating layer is bared, the remanent resin serving as a mask for the etching, depositing the layers permitting the making of the electrical contacts and the electrodes of the source and of the drain, eliminating the remanent resin (10a), and etching the electrodes of the source and of the drain.

5 Claims, 4 Drawing Figures

PROCESS FOR THE MANUFACTURE OF A SELF-ALIGNED THIN-FILM TRANSISTOR

BACKGROUND OF THE INVENTION

The subject matter of the present invention is a process for the manufacture of a thin-film transistor with a selfaligned grid.

It permits particularly the manufacture of thin-layer semiconductor components which can serve for making active matrices for planar liquid crystal displays, for making photodiode matrices, and in general for the multiplexing of components arrayed in matrix form, as well as for making charge transfer devices (DTC [French] or CCD in English).

The various known techniques for making thin-film transistors, particularly photolithography with mask alignment or evaporation and masking for CdSe semiconductors, lead inevitably to causing the transistor grid to be overlapped by the source and drain of the latter. These overlaps introduce stray capacitances whose relative importance increases as the length of the transistor channel decreases. These capacitances are particularly prejudicial to the operation of thin-layer transistors made in hydrogenated amorphous silicon, because they introduce, among other things, an increase of the response time of the component and an unacceptable DC voltage level when these components are used in liquid crystal display devices.

Recently a new thin-layer transistor manufacturing process has been proposed enabling the transistor grid to be aligned with the drain and source of the latter, and thus to eliminate the overlap capacitances almost entirely. Such a process has been described in an article in IEEE Electron Device Letters, vol. EDL 3, No. 7, July 1982, entitled, "A self-alignment process for amorphous silicon thin film transistors," by T. Kodama.

Unfortunately, this new process is too complex to be used for the mass production of thin-layer transistors. In particular, this process comprises a great number of steps as well as a delicate phase of interfacing control at the level of the layer of hydrogenated amorphous silicon which is harmful to the later operation of the component (poor interface condition, creation of a stray channel, etc.). Otherwise, the transistors obtained by this process are by no means "electrically" coplanar, that is, the channel and the drain and source electrodes of the transistors are not at all in the same plane.

SUMMARY OF THE INVENTION

The object of the present invention is precisely a process for the production of a thin-film transistor, which will make it possible to overcome these problems. Particularly it permits aligning the transistor grid with the drain and source of the transistor while eliminating the interface in the hydrogenated amorphous silicon layer. Moreover, the structure of the transistors obtained is "electrically" coplanar.

More precisely, the subject matter of the invention is a process for producing a self-aligned thin-film transistor, which includes the following steps:

(a) producing the transistor grid on a substrate of glass, (b) depositing an insulating layer on the substrate and grid, (c) depositing a thick, hydrogenated amorphous silicon layer on the insulating layer, (d) depositing a positive photosensitive resin layer on the silicon layer, the resin layer being sensitive to light having a wavelength greater than 550 nanometers, (e) irradiating the resin layer through the substrate, the grid serving as a mask for the irradiation, (f) development of the resin layer, leading to the elimination of the irradiated zones of the said resin layer, (g) etching the silicon layer until the insulating layer is laid bare, the remaining resin serving as a mask for the said etching, (h) creating electrical contacts and the source and drain electrodes of the transistor, and (i) eliminating the remaining resin.

Advantageously, the hydrogenated amorphous silicon layer has a thickness of 150 to 300 nanometers (1500 to 3000 Angstroms).

The use of a thicker layer of amorphous silicon than the layer used in the article cited above makes it possible to avoid the interface problems at the level of this silicon layer. It also permits obtaining an electrically coplanar structure.

Preferably, the photosensitive resin is sensitive to visible light having particularly a wavelength of the order of 600 nanometers.

The use of a photosensitive resin sensitive to light of a wavelength greater than 550 nanometers and preferably of the order of 600 nanometers permits reducing the insolation time of the photosensitive resin by a factor of 10 with respect to resins sensitive to ultraviolet light.

According to a preferred embodiment of the process of the invention, the latter includes, after step (g), the following steps:

depositing a layer of n+ type amorphous silicon on the entire structure, depositing a conducting layer on the n+ type silicon layer, eliminating the regions of the conductive layer and of the n+ type silicon layer which are situated at the grid, and producing the electrodes of the source and drain in the conducting layer by photolithography.

Advantageously, the conducting layer is a layer of chromium and the insulating layer a layer of silicon dioxide.

BRIEF DESCRIPTION OF THE DRAWINGS

Other characteristics and advantages of the invention will be made clear by the description that follows, given by way of explanation but not restrictively, in conjunction with the appended FIGS. 1 to 4, which illustrate the different steps of the process of the invention.

DESCRIPTION OF THE PREFERRED EMBODIMENT

Figure 1:
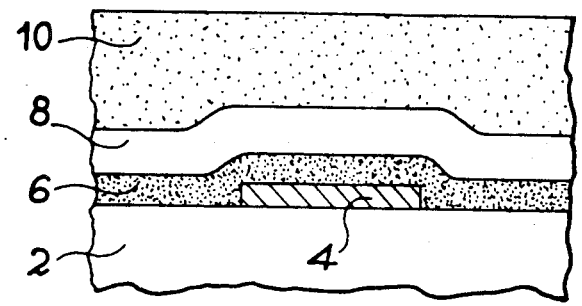

As represented in FIG. 1, the first step of the process consists in making, on a glass substrate 2, the grid 4 of the transistor, using classical methods of photolithography (masking and etching). This grid 4, having for example a thickness of 100 nm (1,000 Angstroms), is made preferably of chromium.

Then an insulating layer 6, made preferably of silicon dioxide, is deposited on the substrate 2 and the transistor grid 4. This insulating layer, having for example a thickness of 100 nm (1,000 Angstroms) can be obtained by the vacuum or vacuumless chemical vapor coating technique, or by the glow discharge technique, in a radiofrequency apparatus, using a gaseous mixture of silane and oxygen.

Then a heavy layer 8 of hydrogenated amorphous silicon, advantageously having a thickness varying from 150 nm to 300 nm (1600 to 3000 Angstroms), is deposited on the insulating layer 6. Preferably, the thickness of the silicon layer is close to 150 nm (1600 Angstroms). This layer of silicon can be obtained by the glow discharge technique using silane as gas.

The next step in the process consists in depositing on the thick layer 8 of amorphous silicon a layer 10 of positive photosensitive resin 10 sensitive to light having a wavelength greater than 550 nanometers, for example between 600 and 700 nanometers. This resin layer can be deposited particularly by centrifugation. Phenol formaldehyde resins, such as the one sold by Hunt under the reference HPR 204, can be used as the resin.

Figure 2:
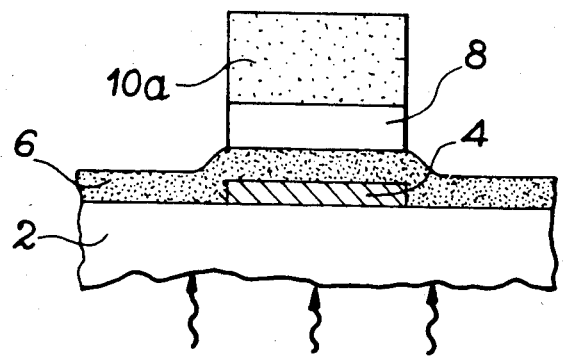

As represented in FIG. 2, the layer of photosensitive resin 10 is then irradiated through the substrate 2, the grid 4 then serving as a mask for the irradiation. The use of a resin sensitive in the visible [spectrum] permits reducing the duration of this irradiation. The development of the resin layer permits the retention of this layer only in zone 10a, situated in line with the grid of the transistor, the irradiated zones being eliminated.

The next step of the process consists in etching the layer 8 of hydrogenated amorphous silicon, particularly by a dry etching, using a plasma of sulfur hexafluoride, the remanent resin 10 serving as a mask for the said etching.

Figure 3:
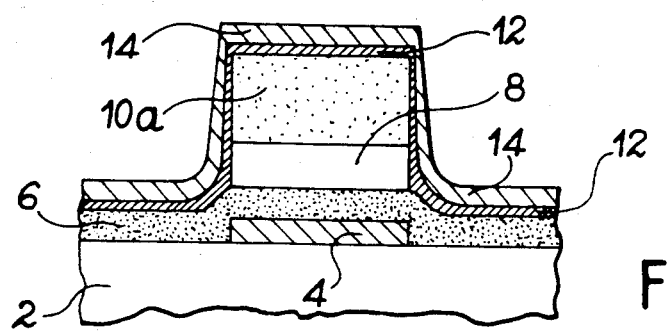
Figure 4:
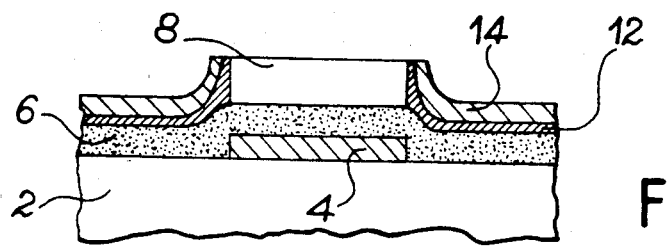

As represented in FIG. 3, a layer 12 of amorphous silicon of type n+, hydrogenated or not, having a thickness of 50 nm (500 Angstroms), for example, is then deposited on the entire structure. This silicon layer 12, deposited by the same technique as for the hydrogenated amorphous silicon, permits the creation of ohmic contacts for the source and drain of the transistor. This layer 12 is then covered with a conducting layer 14 made preferably of chromium. This conducting layer 14, having a thickness for example of 150 nm (1500 Angstroms), is obtained by deposition, for example by vacuum evaporation or by spraying.

The regions of the conducting layer 14 and of the type n+ silicon layer 12 which are situated in line with the grid 4 of the transistor, and the remanent resin 10a, are eliminated by the technique known by the English expression, "lift-off." Then the source and drain electrodes of the transistor are produced in what remains of the conducting layer 14, by the common processes of photolithography (masking and etching).

The process described above, due to the use of a thick hydrogenated amorphous silicon layer, permits obtaining a grid that is self-aligned with respect to the source and drain of the transistor.

It furthermore permits obtaining an "electrically" coplanar structure, like that obtained in MOS transistors, in which the channel of the transistor and the drain and source electrodes are situated in the same plane. This permits limiting the access resistances of the transistor; the access of the channel of the transistor is direct, which is not the case in the transistors of the prior art.

Lastly, the process of the invention is easy to employ, and involves no critical steps.

We claim:

1. Process for producing a thin-film self-aligned grid transistor, comprising the following steps:
    (a) forming the grid of the transistor on a glass substrate;
    (b) depositing an insulating layer on the substrate and a gate;
    (c) depositing a layer of hydrogenated amorphous silicon on said insulating layer in an amount sufficient to provide a thickness of from about 150 to 300 nanometers;
    (d) depositing on said silicon layer a layer positive photosensitive resin sensitive to light and having a wavelength greater than 550 nanometers;
    (e) irradiating said resin layer through said substrate, the gate serving as a mask for the irradiation;
    (f) developing the resin layer leading to the elimination of the irradiated zones of the said resin layer;
    (g) etching said silicon layer until said insulating layer is laid bare, the residual resin serving as a mask for the said etching;
    (h) connecting the electrical contacts and the electrodes of the source and drain of the transistor; and
    (i) eliminating the residual resin.

2. A process according to claim 1, wherein the photosensitive resin is sensitive to light having a wavelength of the order of 600 nanometers.

3. A process according to claim 1, wherein step (h) comprises:
    depositing a layer of n+ type amorphous silicon on the entire structure;
    depositing a conducting layer on the type n+ silicon layer;
    eliminating the regions respectively of the conducting layer and of the type n+ silicon layer situated in line with said grid; and
    making the electrodes of the source and of the drain in said conducting layer.

4. A process according to claim 1, wherein said insulating layer is a layer of silicon dioxide.

5. A process according to claim 3, wherein said conducting layer is a layer of chromium.

* * * * *